United States Patent [19]

Ludikhuize

[11] Patent Number: 6,160,304
[45] Date of Patent: Dec. 12, 2000

[54] SEMICONDUCTOR DEVICE COMPRISING A HALF-BRIDGE CIRCUIT

[75] Inventor: Adrianus W. Ludikhuize, Eindhoven, Netherlands

[73] Assignee: U. S. Phillips Corporation, New York, N.Y.

[21] Appl. No.: 09/179,284

[22] Filed: Oct. 27, 1998

[30] Foreign Application Priority Data

Oct. 28, 1997 [EP] European Pat. Off. .............. 97203346

[51] Int. Cl.$^7$ ........................... H01L 29/00; H01L 23/58; H01L 29/76

[52] U.S. Cl. .......................... 257/549; 257/343; 257/492; 257/544

[58] Field of Search ..................................... 257/141, 335, 257/343, 373, 375, 376, 490–495, 544–556

[56] References Cited

U.S. PATENT DOCUMENTS

| | | | |
|---|---|---|---|
| 5,072,287 | 12/1991 | Nakagawa et al. ......................... | 357/50 |
| 5,156,989 | 10/1992 | Williams et al. ........................... | 437/41 |
| 5,286,995 | 2/1994 | Malhi ........................................ | 257/549 |
| 5,373,435 | 12/1994 | Jayaraman et al. ........................ | 363/98 |
| 5,376,832 | 12/1994 | Gariboldi et al. ......................... | 327/108 |
| 5,473,183 | 12/1995 | Yanemoto ................................. | 257/371 |
| 5,475,273 | 12/1995 | Paparo et al. ............................. | 327/545 |
| 5,834,826 | 11/1998 | Menegoli ................................. | 257/546 |

FOREIGN PATENT DOCUMENTS

| | | | |
|---|---|---|---|
| 352067580 | 6/1988 | Japan ...................................... | 257/549 |
| 363137476 | 6/1988 | Japan ...................................... | 257/549 |

OTHER PUBLICATIONS

"A Versatile 250/300 V IC Process for Analog and Switching Applications", by Adriaan W. Ludikhuize, IEEE Transactions on Electron Devices, vol. ED–33, No. 12, Dec. 1986, pp. 2008–2015.

"High Voltage, High Current Lateral Devices", By H.M.J. Vaes et al., Proc. IEDM 1980, pp. 87–90.

*Primary Examiner*—Tom Thomas
*Assistant Examiner*—Ori Nadav
*Attorney, Agent, or Firm*—Steven R. Biren

[57] ABSTRACT

The invention relates to a half-bridge circuit comprising two series-connected n-channel DMOS transistors, in which the source of the one transistor, the low-side transistor $T_1$, is connected to a low-voltage terminal $V_{ss}$, and the drain of the other transistor, the high-side transistor $T_2$, is connected to a high-voltage terminal $V_{dd}$. The drain of the low-side transistor and the source of the high-side transistor are connected to the output terminal (4). The circuit is arranged in a semiconductor body having an n-type or p-type epitaxial layer (11) which is applied to a p-type substrate (10). In the epitaxial layer, two n-type regions are defined for the transistors, each of said regions forming a drift region of one of the transistors and being surrounded by a cup-shaped n-type zone in the semiconductor body. Within the n-type cup-shaped zone (12) of the low-side transistor $T_1$, there is provided a p-type cup-shaped zone which isolates the drift region (15) of $T_1$ from the cup-shaped zone (12) and which is connected, along with the cup-shaped zone (12), the backgate region (17) and the source (19) of $T_1$, to $V_{ss}$. In the high-side transistor, the n-type cup-shaped region (13) is connected, together with the drain, to $V_{dd}$. As in the case of the low-side transistor, the n-type cup-shaped zone is at a fixed voltage, it is precluded that electrons are injected by this zone into the substrate, and, consequently, also the risk of latch-up and disturbances in the rest of the circuit is precluded. It is also precluded that, at a higher resistivity of the substrate, voltage jumps occur in the substrate, which could also give rise to latch-up and disturbances. In addition, at least the low-side transistor can be constructed in such a manner that the RESURF condition is met, thus enabling the device to be used also at a high voltage.

4 Claims, 2 Drawing Sheets

SEMICONDUCTOR DEVICE COMPRISING A HALF-BRIDGE CIRCUIT

BACKGROUND OF THE INVENTION

Semiconductor device comprising a half-bridge circuit The invention relates to a semiconductor device comprising a half-bridge circuit with two n-channel DMOS transistors forming a series connection between a terminal $V_{SS}$ for a low voltage and a terminal $V_{dd}$ for a high voltage, which semiconductor device also comprises a semiconductor body with a p-type substrate and, provided on said substrate, an epitaxial layer in which, for the transistors, two separate regions are defined which are surrounded within the semiconductor body by two electrically insulated cup-shaped n-type zones which each have a bottom formed by a buried n-type zone at the interface between the substrate and the epitaxial layer, and a raised wall formed by an n-type zone which extends from the surface across the thickness of the epitaxial layer to the underlying buried zone, each of the transistors comprising an n-type source and drain zone, the source zone of each transistor being located in a p-type backgate region, and, of one of the transistors, hereinafter referred to as first transistor, the source zone being connected to $V_{ss}$ and the drain zone being connected to the source zone of the second transistor whose drain zone is connected to $V_{dd}$. Such a device, which can be used, for example, in an electronic ballast for gas-discharge lamps or in driver circuits for motors is known, inter alia, from the article "A versatile 250/300-V IC process for analog and switching applications" A. W. Ludikhuize, published in IEEE Transactions on Electron Devices, Vol. ED-33, No. 12, December 1986, pp. 2008/2015. The use of two half bridges enables the circuit to be readily extended to a full bridge circuit. The use of DMOS transistors has various advantages which are known per se, such as sturdiness, which makes the transistor resistant to high voltages and/or high powers. In addition, this type of transistor can very suitably be used in the case of inductive loads as a result of which the voltage at the output may be higher than $V_{dd}$ and lower than $V_{ss}$, as the electric charge can be efficiently removed via the body diode of the DMOS.

In the known device, an n-type epitaxial layer is used in which islands are formed in known manner by means of a deep p-type diffusion, which islands accommodate the transistors; see, in particular, FIG. 14 and FIG. 15 of said publication. The half bridge is constructed symmetrically, that is, the construction of the transistors is identical. As a result, the n-type cup-shaped zone is connected, both in the first transistor (also referred to as low-side transistor) and in the second transistor (also referred to as high-side transistor), to the drain. In the case of the high-side transistor, this will generally not be problematic. In the low-side transistor, however, the drain, and hence the n-type cup-shaped zone, is coupled to the output of the (half) bridge and thus its potential varies. In the case of an inductive load, the voltage at the output, that is the node of the drain of the first transistor and the source of the second transistor, may be reduced to a level which is lower than the substrate voltage, so that the pn-junction between the substrate and the n-type cup-shaped zone of the first transistor becomes forward-poled and electrons are injected into the substrate. This may cause disturbances in other circuit elements or latch-up. In addition, so-called dV/dt effects may occur, which, in the case of a rapid increase of the potential on the output, also cause a local increase of the potential in the, generally rather high-ohmic, substrate, so that one may observe the occurrence of disturbances and latch-up with neighboring n-type zones at, for example 0 V.

SUMMARY OF THE INVENTION

It is an object of the invention to provide, inter alia, a half-bridge circuit comprising two series-connected n-channel DMOS transistors, in which these drawbacks are overcome or at least substantially reduced compared to the known device. To achieve this, a semiconductor device in accordance with the invention is characterized in that within the n-type cup-shaped zone belonging to the first transistor, a p-type cup-shaped zone is formed whose bottom is formed by a p-type buried zone which is isolated from the substrate by the buried n-type zone of the n-type cup-shaped zone, and the raised wall of said p-type cup-shaped zone being formed by a p-type zone which extends from the surface to the buried p-type zone, the n-type source and drain zones and a p-type backgate region of the first transistor being arranged in the region surrounded by the p-type cup-shaped zone, and the n-type and p-type cup-shaped zones both being connected to the source zone and the backgate region and to $V_{ss}$, and the n-type source and drain zones and a p-type backgate region of the second transistor being arranged in the region which is defined by the second n-type cup-shaped zone and which is connected to $V_{dd}$. The p-type cup-shaped zone enables the n-type cup-shaped zone of the first transistor (low-side transistor) to be electrically insulated from the drain. By virtue thereof, the voltage $V_{ss}$ can be applied to the n-type cup-shaped zone, thereby precluding that the pn-junction between this zone and the substrate, to which substrate generally also a low voltage is applied, is forward biased when subjected to an inductive load. Moreover, the above-described dV/dt effects are suppressed completely, or at least to a substantial degree, in that the n-type cup-shaped zone is at a fixed potential.

The epitaxial layer may be of the n-type, with parts of the epitaxial layer being suitable for use as a drift region of the transistors. An embodiment which provenly offers particular advantages is characterized in that the epitaxial layer is of the p-type, in which, in each of the regions defined by the cup-shaped zones, an n-type zone, referred to as well, is formed, the well belonging to the first transistor being separated from the associated n-type cup-shaped zone by the p-type cup-shaped zone, and the n-type well belonging to the second transistor being conductively connected to the associated n-type cup-shaped zone.

Since the n-type cup-shaped zone no longer forms part of the drain of the low-side transistor, the n-type drift region within which the drain zone is formed can be given such a thickness and doping concentration that, in case the device must be operated at a high voltage, the resurf (reduced surface field) condition is met. Therefore, a preferred embodiment of a semiconductor device in accordance with the invention is characterized in that the overall doping level of the n-type well of the first transistor, in a direction transverse to the surface, is, at least locally, at most substantially equal to $3 \cdot 10^{12}$ atoms per $cm^2$. As is generally known, this condition enables the n-type region to be depleted throughout its thickness before the occurrence of breakdown. Depletion causes the electric fields at the surface to be reduced such that the breakdown voltage becomes (substantially) equal to the theoretically maximum breakdown voltage.

A further embodiment which, inter alia, has the advantage that also in the other transistor (i.e. high-side transistor), the resurf condition can be met, is characterized in that in the region defined by the n-type cup-shaped zone belonging to the second transistor, a p-type cup-shaped zone is arranged having a bottom formed by a buried p-type zone which is separated from the p-type substrate by the intermediate bottom of the n-type cup-shaped zone, and having a raised wall formed by a p-type region extending from the surface across the epitaxial layer to the buried p-type zone, the n-type source and drain zones and the p-type backgate region of the second transistor being formed in the region of the epitaxial layer surrounded by the cup-shaped p-type zone, and the source zone and the backgate region being jointly connected to the p-type cup-shaped zone.

BRIEF DESCRIPTION OF THE DRAWINGS

These and other aspects of the invention will be apparent from and elucidated with reference to the embodiments described hereinafter.

In the drawings.

Figure 1:
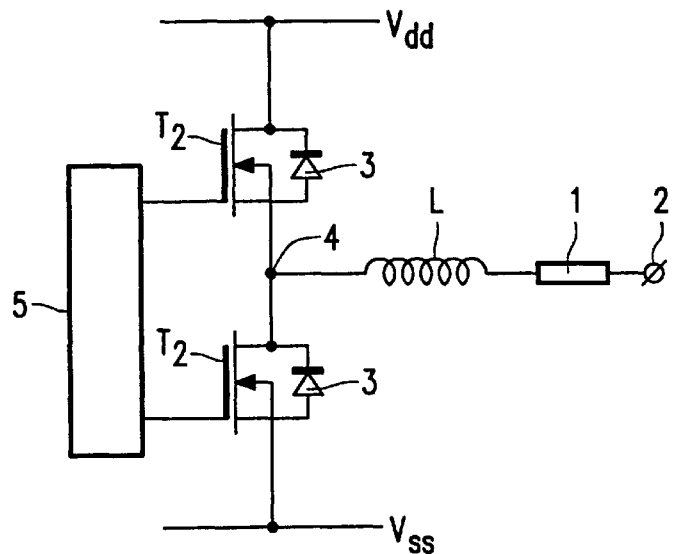
FIG. 1 shows a circuit diagram of a half-bridge circuit with two n-channel DMOS transistors.

It is noted that the sectional views shown in the drawing are schematic and not to scale.

DESCRIPTION OF THE PREFERRED EMBODIMENTS

FIG. 1 shows a circuit diagram of a half-bridge circuit by means of which an alternating current can be sent through a load 1 with an inductance L, for example a motor winding. The current is supplied by a power supply having a terminal $V_{dd}$ for the high voltage and a terminal $V_{ss}$ for the low voltage. The bridge circuit comprises two n-channel transistors $T_1$ (low side) and $T_2$ (high side) of the DMOS type. The drain of the low-side transistor and the source of the high-side transistor are jointly connected to the output 4 of the bridge. The source of $T_1$ and the drain of $T_2$ are connected, respectively, to $V_{ss}$ and $V_{dd}$. The DMOS transistors have an internal diode 3, also referred to as body diode, which is situated between the source and the drain, the anode of said diode being formed by the backgate region connected to the source, and the cathode of said diode being formed by the drain. The effect produced by this diode will be described hereinafter. The gate electrodes of the transistors are connected to a control circuit 5, only schematically shown in the drawing, which supplies control signals, so that the transistors are conducting and non-conducting substantially in phase-opposition, and the current can be carried, by the load 1, alternately in the one direction and the other direction. A terminal 2 of the load 1 can be connected to a point of a fixed potential, for example halfway $V_{dd}$ and $V_{ss}$. At higher power values, it may be advantageous to connect said terminal 2 to the output of a similar half-bridge circuit, thus forming a full-bridge circuit. For 3-phase applications, use can be made of three half bridges as shown in FIG. 1.

If, during operation, $T_1$ is conducting, electric current flows from terminal 2 to $V_{ss}$. When $T_1$, is opened (non-conducting), current remains flowing at first due to the presence of the inductance L, so that the potential on the output 4 will increase and may even become higher than $V_{dd}$. The bridge can be discharged again via the diode 3 of $T_2$. Conversely, when $T_2$ is conducting and the current flows from $V_{dd}$ to terminal 2, deactivation of $T_2$ may cause the potential on the output 4 to decrease to a value below $V_{ss}$, and the electric charge can be removed via the body diode 3 of $T_1$.

Figure 2:
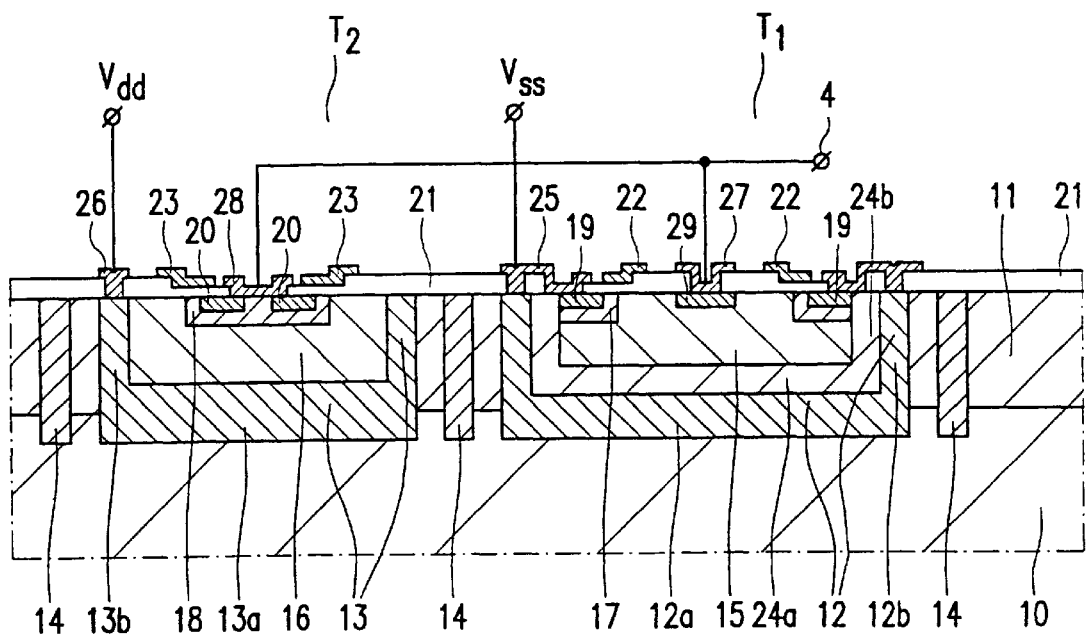
FIG. 2 is a sectional view of a first embodiment of a semiconductor device comprising such a circuit in accordance with the invention.

FIG. 2 is a sectional view of an embodiment of a semiconductor device in accordance with the invention. Said device comprises a p-type silicon substrate 10. The resistivity of the substrate is selected taking into account the maximum voltages it should be able to cope with, during operation, without the occurrence of breakdown, and amounts typically to, for example, 10 Ω·cm. The substrate 10 is epitaxially provided with a p-type layer 11 having a thickness, for example, of 5 μm and a resistivity of 10 Ω·cm. In the epitaxial layer 11, two separate regions are defined, i.e. a first region for $T_1$, which is surrounded by the n-type cup-shaped zone 12, and a second region for $T_2$, which is surrounded by the n-type cup-shaped zone 13. The zones 12 and 13 are electrically separated from each other by intermediate parts of the p-type epitaxial layer 11 in which, if desired, highly doped p-type zones 14 may be provided. Said cup-shaped zones each comprise a bottom 12a, 13a which is provided as a highly doped buried n-type zone between the substrate and the epitaxial layer, while the raised walls of the cup-shaped zones are formed by highly doped zones 12b, 13b extending from the surface of the epitaxial layer to the buried zones and forming a coherent zone with said buried zones. The regions surrounded by the zones 12 and 13 are provided with relatively low-doped n-type zones 15 and 16, hereinafter referred to as well, which form drift regions of the DMOS transistors. Each n-type drift region comprises a p-type surface zone 17, 18, respectively, which forms a backgate region of the transistor. The source of the transistors comprises a highly-doped n-type surface zone 19, 20, respectively, which is arranged in the p-type backgate region. The surface of the epitaxial layer is covered with a dielectric layer 21 which, at the location of the channels of the transistors, changes into gate oxide on which the gate electrodes 22 and 23 are formed. The electrodes 22 and 23, which are customarily used to align the backgate regions 17, 18 and the source zones 19, 20 with respect to each other, are generally made of doped polycrystalline silicon (poly).

In accordance with the invention, in the region surrounded by the cup-shaped n-type zone 12, a second, p-type cup-shaped zone 24 is provided which isolates the n-type drift region 25 from the n-type cup-shaped zone 12. The bottom of the cup-shaped zone 24 is formed by a buried p-type layer; the raised wall 24b is formed by a p-type zone which extends from the surface to the buried layer 24b. The n-type cup-shaped zone and the p-type cup-shaped zone are both connected to the n-type source 19 and the backgate region 17. In the present example, the p-type backgate region 17 and the p-type cup-shaped zone 24 border on each other and are connected, together with the n-type cup-shaped zone, to $V_{ss}$, via the metal source contact 25 which contacts these zones via windows in the oxide layer 21. On the other hand, at least in this example in which there is only one source zone, the n-type cup-shaped zone forms the drain zone of $T_2$ and is connected via the connection 26 to $V_{dd}$.

The drain zone of $T_1$ is formed by the highly doped n-type zone 29 which is separated by the p-type zone 24 from the n-type zone 12 and the substrate 10. The drain zone 29 and the source zone 20 of $T_2$ are connected to the output terminal 4 via, respectively, the contacts 27 and 28.

Since fixed voltages, i.e. $V_{ss}$ and $V_{dd}$, are applied to the n-type cup-shaped zones 12 and 13, respectively, it is precluded that large voltage changes occur in the substrate 1, which, in the known device, are caused by rapid and large voltage jumps at the output of the bridge circuit in combination with the relatively high resistivity of the substrate 11. As the n-type cup-shaped region 12 which belongs to the low-side transistor $T_1$ is connected to earth and not to the drain 29 and the output 4, it is additionally precluded that the pn-junction between this zone and the p-type substrate becomes forward-poled when the output obtains a negative potential as a result of the inductive load. The charge is drained completely via the pn-junction between the p-type zones 19, 24 and the n-type zones 15, 29 (body diode 3 of transistor $T_1$). If the potential on the output terminal 4 becomes very high, that is higher than $V_{dd}$, then, in the high-side transistor $T_2$, the pn-junction between the back-gate region 18 and the drain 13, 16 (body diode 3 of $T_2$) becomes forward-poled. In combination with the p-type substrate 10, these zones form a parasitic vertical pnp-transistor. As the voltage between the emitter (p-type zone 18) and the collector (p-type substrate 10) is large, it is very important that the current passing through this parasitic transistor remains low so as to preclude that too much heat is generated. In the present example, this is achieved by the high doping level of the n-type zone 13 which forms part of the base of the transistor, so that substantially all of the charge is removed by the body diode 3 of the DMOS transistor.

A further advantage of the device described herein can be achieved by selecting the doping level of the n-type drift region 15 of the low-side transistor to be such that the RESURF condition is met. The RESURF condition is described, inter alia, in the article "High Voltage, High Current Lateral Devices" by H. Vaes and J. Appels, published in Proc. IEDM 1980, pp. 87/90. The meaning of this condition can be expressed as follows:

the product of the thickness and the doping concentration of the n-type drift region 15 is, at least locally, (substantially) equal to $10^{12}$ atoms per $cm^2$. These circumstances enable the n-type region 15 to be, at least locally, depleted from the buried p-type layer across its entire thickness, so that the electric fields at the surface are substantially reduced and electric breakdown occurs at a much higher voltage than in situations where this depletion is absent. In the present example, in which the thickness of the n-type drift region 15 is approximately 3 μm, the (average) doping concentration amounts to approximately $5 \cdot 10^{15}$ atoms per $cm^3$.

Figure 3:
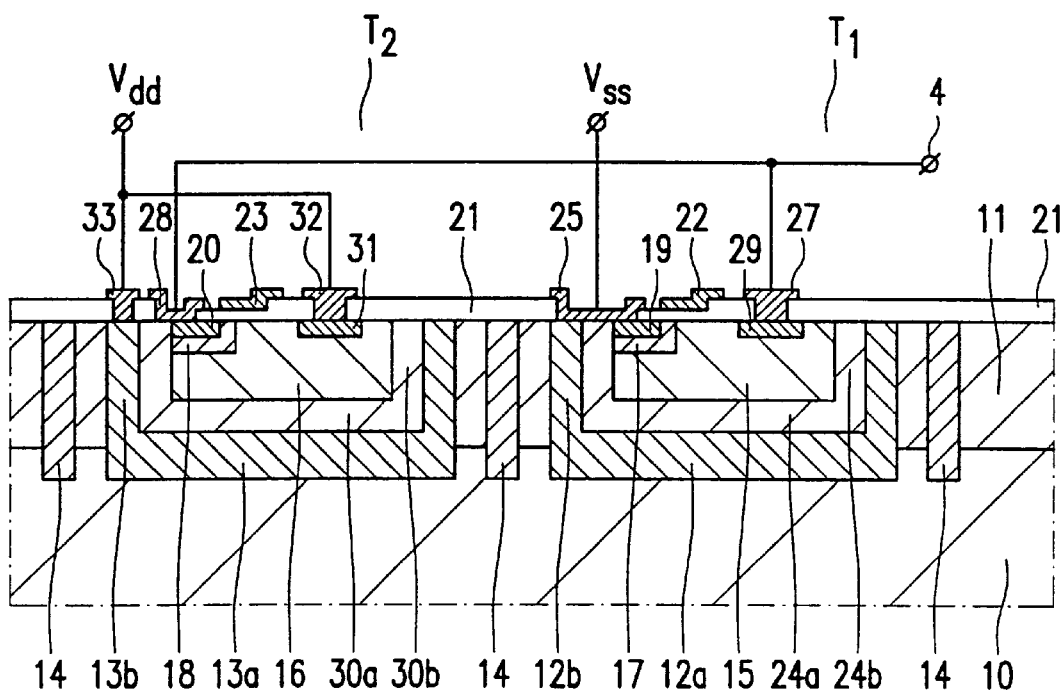
FIG. 3 is a sectional view of a variant of the embodiment in the preceding example.

A variant of the embodiment shown in FIG. 2 is shown in FIG. 3. Apart from the fact that, for the sake of simplicity, the transistor of FIG. 3 comprises only one source zone 19, transistor $T_1$ is practically identical to $T_1$ of the preceding example. Unlike the preceding example, in the embodiment shown in FIG. 3 also transistor $T_2$ comprises a cup-shaped p-type zone 30 which is situated within the region defined by the cup-shaped n-type zone 13. Said cup-shaped zone 30 comprises a buried p-type layer 30a, separated from the p-type substrate 10 by the buried n-type layer 13a, and a raised wall 30b which extends from the surface to the buried zone 30a in the epitaxial layer 11 and is separated from surrounding parts of the epitaxial layer by the n-type zone 13b. The transistors may be constructed substantially identically, with the backgate region 18 of $T_2$ bordering on the raised wall 30b of the cup-shaped p-type zone 30 which is short-circuited to the source zone via the source contact 28. The drain comprises a highly doped n-type zone 31 which is provided with a drain contact 32. The n-type cup-shaped zone 13 includes a contact 33 which, together with the drain contact 32, is connected to $V_{dd}$.

During operation, the pn-junction between the cup-shaped zones 13 and 30 may become forward-poled. The holes injected into the zone 13 will be retarded by the highly doped n-type zone 13, thus precluding diffusion of these holes to the substrate 10. In addition, a suitable choice of the doping concentration of the drift region 16 of $T_2$ enables also the high-side transistor to be constructed as a RESURF transistor, in a manner similar to that of the low-side transistor $T_1$.

In the examples described above, the source zone of transistor $T_1$ is directly connected to $V_{ss}$. It is alternatively possible, however, to provide a resistor in the current path between the terminal $V_{ss}$ and the source zone 19, so that the voltage or source zone 19, and contact 25 may differ slightly from that on $V_{ss}$. Such a resistor, which may have a low value, for example, of 0.1 ohm, can be used, for example, as a sense-resistance to determine the current.

It will be obvious that the invention is not limited to the examples described hereinabove, and that within the scope of the invention many variations are possible to those skilled in the art. For example, in the above-described examples, an n-type epitaxial layer can be used instead of a p-type layer. In addition, it is alternatively possible to provide the n-type drift regions in only a part, which borders on the highly-doped drain zones, of the regions surrounded by the cup-shaped zones, so that parts of the epitaxial layer around the backgate regions continue to be of the p-type. It is also possible to provide the transistors with a larger number of source regions forming an interdigital configuration with intermediate drain regions.

What is claimed is:

1. A semiconductor device comprising a half-bridge circuit with two n-channel DMOS transistors forming a series connection between a terminal $V_{ss}$ for a low voltage and a terminal $V_{dd}$ for a high voltage, which semiconductor device also comprises a semiconductor body with a p-type substrate and, provided on said substrate, an epitaxial layer having a surface in which, for the transistors, two separate regions are defined which are surrounded within the semiconductor body by two electrically insulated cup-shaped n-type zones which each have a bottom formed by a buried n-type zone at the interface between the substrate and the epitaxial layer, and a raised wall formed by an n-type zone which extends from the surface across the thickness of the epitaxial layer to the underlying buried zone, each of the transistors comprises an n-type source and drain zones, the source zone of each transistor being located in a p-type backgate region, and, of one of the transistors, hereinafter referred to as first transistor, the source zone being connected to $V_{ss}$ and the drain zone being connected to the source zone of the second transistor whose drain zone is connected to $V_{dd}$, characterized in that within the n-type cup-shaped zone of the first transistor, a p-type cup-shaped zone is formed whose bottom is formed by a p-type buried zone which is isolated from the substrate by the buried n-type zone of the n-type cup-shaped zone, and the raised wall of said p-type cup-shaped zone being formed by a p-type zone which extends from the surface to the buried p-type zone, the n-type source and drain zones and a p-type backgate region of the first transistor being arranged in the region surrounded by the p-type cup-shaped zone, and the n-type and p-type cup-shaped zones both being connected to the source zone and the backgate region and to $V_{ss}$, and the n-type source and drain zones and a p-type backgate region of the second transistor being arranged in the region which is defined by the second n-type cup-shaped zone and which is connected to $V_{dd}$.

2. A semiconductor device as claimed in claim 1, characterized in that the epitaxial layer is of the p-type, in which, in each of the regions defined by the cup-shaped zones, an n-type zone, referred to as well, is formed, the well belonging to the first transistor being separated from the associated n-type cup-shaped zone by the p-type cup-shaped zone, and the n-type well belonging to the second transistor being conductively connected to the associated n-type cup-shaped zone.

3. A semiconductor device as claimed in claim 2, characterized in that the overall doping of the n-type well of the first transistor, in a direction transverse to the surface, is, at least locally, at most substantially equal to $3 \cdot 10^{12}$ atoms per cm$^2$.

4. A semiconductor device as claimed in claim 1, characterized in that in the region defined by the n-type cup-shaped zone belonging to the second transistor, a p-type cup-shaped zone is arranged having a bottom formed by a buried p-type zone which is separated from the p-type substrate by the intermediate bottom of the n-type cup-shaped zone, and having a raised wall formed by a p-type region extending from the surface across the epitaxial layer to the buried p-type zone, the n-type source and drain zones and the p-type backgate region of the second transistor being formed in the region of the epitaxial layer surrounded by the cup-shaped p-type zone, and the source zone and the backgate region being jointly connected to the p-type cup-shaped zone.

* * * * *